United States Patent
Zhou et al.

(10) Patent No.: US 8,285,030 B2
(45) Date of Patent: Oct. 9, 2012

(54) DETERMINING CALIBRATION PARAMETERS FOR A LITHOGRAPHIC PROCESS

(75) Inventors: Xin Zhou, Saratoga, CA (US); Yaogang Lian, Oakville (CA); Robert E. Gleason, San Carlos, CA (US)

(73) Assignee: Synopsys, Inc., Mountain View, CA (US)

( * ) Notice: Subject to any disclaimer, the term of this patent is extended or adjusted under 35 U.S.C. 154(b) by 403 days.

(21) Appl. No.: 12/724,362

(22) Filed: Mar. 15, 2010

(65) Prior Publication Data

US 2011/0222739 A1    Sep. 15, 2011

(51) Int. Cl.
*G06K 9/00*    (2006.01)
(52) U.S. Cl. ........ 382/144; 382/141; 382/145; 382/147; 382/151; 382/181; 355/55; 355/77; 355/53; 355/72; 355/75
(58) Field of Classification Search ............... 382/144, 382/141, 145, 147, 151, 181; 355/55, 77, 355/53, 72, 75
See application file for complete search history.

(56) References Cited

U.S. PATENT DOCUMENTS

| | | | |
|---|---|---|---|
| 6,567,717 B2 * | 5/2003 | Krivokapic et al. | 700/121 |
| 7,583,359 B2 * | 9/2009 | Moest | 355/55 |
| 2007/0031745 A1 | 2/2007 | Ye et al. | |
| 2008/0301620 A1 | 12/2008 | Ye et al. | |

OTHER PUBLICATIONS

Chen, L. et al., "Predictive Focus Exposure Modeling (FEM) for Full-Chip Lithography," Brion Technologies Inc., Santa Clara, CA, 2007.
Socha, R. et al., "Contact Hole Reticle Optimization by Using Interface Mapping Lithography (IML™)," Optical Microlithography XVII, edited by B. W. Smith, Proceedings of SPIE vol. 5377, (SPIE, Bellingham, WA 2004), pp. 222-240.
Zhang, Q. et al., "Continuous Process Window Modeling for Process Variation Aware OPC and Lithography Verification," Proc. of SPIE vol. 6925, 69251A, (2008), 10 pages.

* cited by examiner

*Primary Examiner* — Mike Rahmjoo
(74) *Attorney, Agent, or Firm* — Fenwick & West LLP

(57) ABSTRACT

A technique for determining a set of calibration parameters for use in a model of a photo-lithographic process is described. In this calibration technique, images of a test pattern that was produced using the photo-lithographic process are used to determine corresponding sets of calibration parameters. These images are associated with at least three different focal planes in an optical system, such as a photo-lithographic system that implements the photo-lithographic process. Moreover, an interpolation function is determined using the sets of calibration parameters. This interpolation function can be used to determine calibration parameters at an arbitrary focal plane in the photo-lithographic system for use in simulations of the photo-lithographic process, where the set of calibration parameters are used in a set of transmission cross coefficients in the model of the photo-lithographic process.

20 Claims, 6 Drawing Sheets

INVERSE
OPTICAL
CALCULATION
300

FORWARD
OPTICAL
CALCULATION
330

IMAGE 610-1 | IMAGE 610-2 | ...

FOCAL PLANE 612-1 | LOCATIONS 614-1 | PIXEL VALUES 616-1 | PHASES (OPTIONAL) 618-1 | ...

INTERPOLATION FUNCTION 710-1 | INTERPOLATION FUNCTION 710-2 | ...

COEFFICIENTS 712-1 | EXPONENTS 714-1 | ...

DETERMINING CALIBRATION PARAMETERS FOR A LITHOGRAPHIC PROCESS

BACKGROUND OF THE INVENTION

1. Field of the Invention

The present invention relates to systems and techniques for determining calibration parameters for a lithographic process.

2. Related Art

Photo-lithography is a widely used technology for producing integrated circuits. In this technique, a light source illuminates a photo-mask. The resulting spatially varying light pattern is projected onto a photoresist layer on a semiconductor wafer by an optical system (which is sometimes referred to as an exposure tool). By developing the 3-dimensional pattern produced in this photoresist layer, a layer in the integrated circuit is created. Furthermore, because there are often multiple layers in a typical integrated circuit, these operations may be repeated using several photo-masks to produce a product wafer.

As dimensions in integrated circuits steadily become a smaller fraction of the wavelength of the light used to expose images of the photo-mask onto the wafer, it is becoming increasingly difficult to design and manufacture photo-masks that produce the desired target wafer pattern on the wafer. As a consequence, the structures in or on the ideal photo-mask (also referred to as the target mask pattern) and/or the physical structures in or on the actual photo-mask bear less and less resemblance to the desired target wafer pattern. These differences between the photo-mask and the target wafer pattern are used to compensate for the diffraction and optical-proximity effects that occur when light is transmitted through the optics of the exposure tool and is converted into the 3-dimensional pattern in the photoresist.

When designing a photo-lithographic process (including the target mask pattern(s) for the photo-mask(s) and/or the corresponding source pattern(s)), the manufacturing performance of a given solution is often evaluated using photo-lithography simulations. In order to improve the accuracy of the predicted manufacturing performance, a lithographic simulator that performs these photo-lithography simulations is usually calibrated based on a test pattern that is produced using the photo-lithographic process. However, the calibration is often only performed for a limited range of lithographic conditions in the photo-lithographic process. Consequently, the simulations may not be accurate over the full range of lithographic conditions in the photo-lithographic process, which may adversely impact the predicted manufacturing performance.

Hence, what is needed is a calibration technique that overcomes the problems listed above.

SUMMARY OF THE INVENTION

The present disclosure relates to a computer system that determines a set of calibration parameters for use in a model of a photo-lithographic process. During operation, the computer system receives images of a test pattern. This test pattern was produced using the photo-lithographic process. Furthermore, the images include a first image at a first focal plane in an optical system, a second image at a second focal plane in the optical system, and a third image at a third focal plane in the optical system, where the first focal plane, the second focal plane and the third focal plane are different. Then, the computer system calculates a first set of calibration parameters associated with the first image, a second set of calibration parameters associated with the second image, and a third set of calibration parameters associated with the third image. Next, the computer system determines an interpolation function based on the first set of calibration parameters, the second set of calibration parameters, and the third set of calibration parameters, where the interpolation function provides the set of calibration parameters corresponding to an arbitrary focal plane in a photo-lithographic system that implements the photo-lithographic process, and where the set of calibration parameters are used in a set of transmission cross coefficients in the model of the photo-lithographic process.

Note that the interpolation function may include a quadratic function of a difference between the arbitrary focus plane and a reference focal plane of the photo-lithographic system. This difference may be normalized by a characteristic wavelength used in the photo-lithographic process and/or a characteristic wavelength used when capturing the images. Additionally, the images may include critical-dimension scanning-electron-microscope images of the test pattern.

Furthermore, the quadratic function may include a constant term which corresponds to an average of the first set of calibration parameters, the second set of calibration parameters, and the third set of calibration parameters. In addition, the quadratic function may include a linear dependence on the difference.

In some embodiments, one of the first focal plane, the second focal plane and the third focal plane is a focal plane of the photo-lithographic system. Moreover, calculating a given set of calibration parameters (which can be the first set of calibration parameters, the second set of calibration parameters or the third set of calibration parameters) associated with a given focal plane (which can be the first focal plane, the second focal plane or the third focal plane) may involve comparing a given image (which can be the first image, the second image or the third image) with a target image corresponding to the test pattern.

In some embodiments, the computer system determines a mask pattern at an object plane in the photo-lithographic system using an inverse optical calculation based on one or more target wafer patterns at one or more focal planes in the photo-lithographic system and the model of a photo-lithographic process. This calculation may use one or more sets of calibration parameters determined using the interpolation function.

Another embodiment provides a method that includes at least some of the operations performed by the computer system.

Another embodiment provides a computer-program product for use with the computer system. This computer-program product includes instructions for at least some of the operations performed by the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description

FIG. 6 is a block diagram illustrating a data structure for use in the computer system of FIG. 5 in accordance with an embodiment of the present disclosure.

FIG. 7 is a block diagram illustrating a data structure for use in the computer system of FIG. 5 in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION OF THE INVENTION

Figure 1:
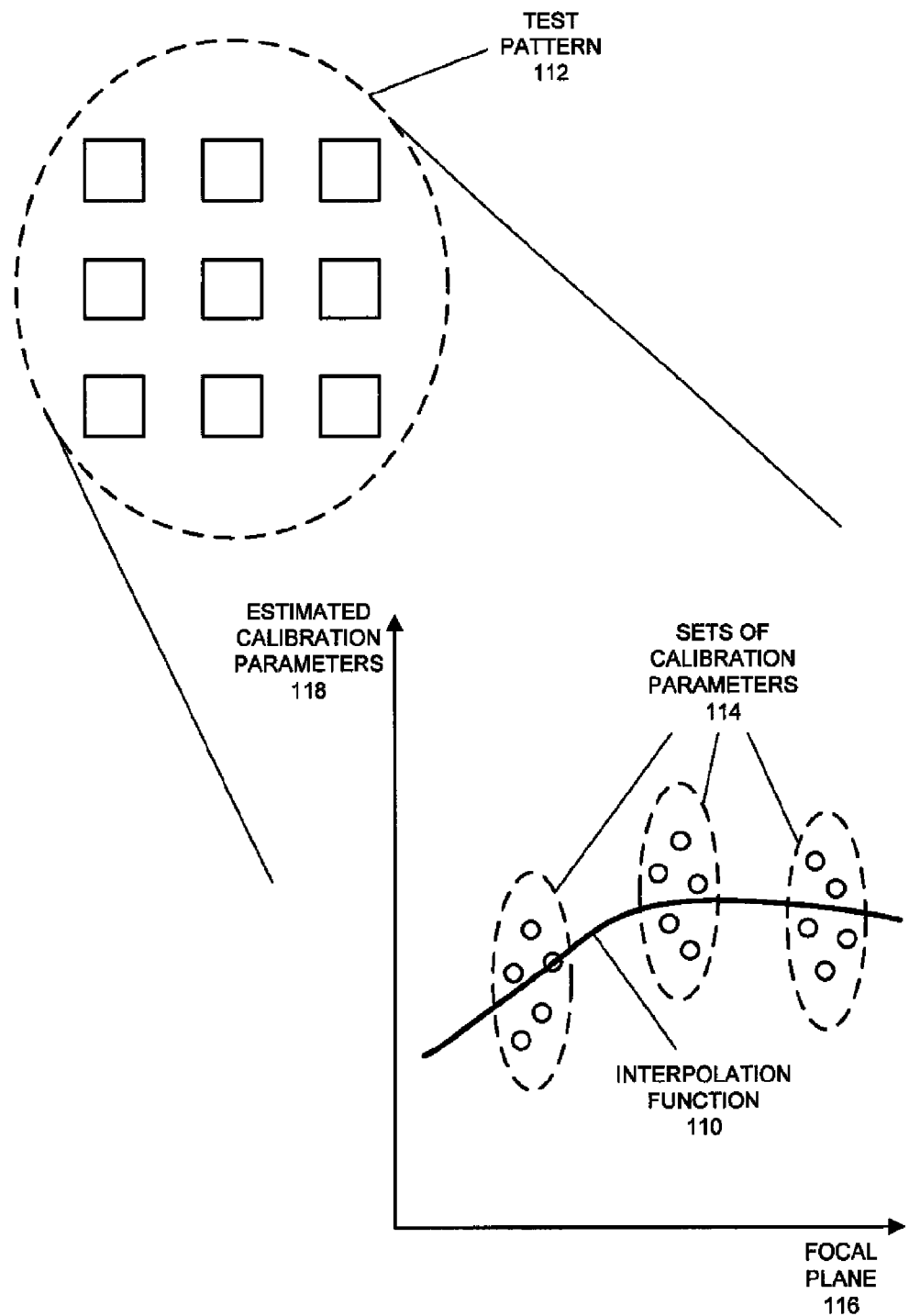
FIG. 1 is a drawing illustrating an interpolation function in a multi-dimensional calibration-parameter space for use in a model of a photo-lithographic process in accordance with an embodiment of the present disclosure.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a technique for determining a set of calibration parameters for use in a model of a photo-lithographic process, and a computer program product (i.e., software) for use with the computer system are described. In this calibration technique, images of a test pattern that was produced using the photo-lithographic process are used to determine corresponding sets of calibration parameters. These images are associated with at least three different focal planes in an optical system, such as a photo-lithographic system that implements the photo-lithographic process. Moreover, an interpolation function is determined using the sets of calibration parameters. This interpolation function can be used to determine calibration parameters at an arbitrary focal plane in the photo-lithographic system for use in simulations of the photo-lithographic process, where the set of calibration parameters are used in a set of transmission cross coefficients in the model of the photo-lithographic process.

By more accurately determining calibration parameters at an arbitrary focal plane, this calibration technique may facilitate more accurate simulations of the photo-lithographic process. In turn, these simulations may be used to more accurately estimate the manufacturing performance of a given design of photo-mask(s) and/or source pattern(s) for use in the photo-lithographic process. Consequently, the calibration technique may result in improved designs and shorter design cycles, which may lead to: improved manufacturing yields, shorter time to market, and, thus, reducing manufacturing costs.

We now describe embodiments of the calibration technique. In this calibration technique, multiple images of a test pattern (such as critical-dimension scanning-electron-microscope images) are made at different focal planes associated with a photo-lithographic system (such as an exposure tool) that fabricated the test pattern using a photo-lithographic process. Using these images, sets of calibration parameters are determined for at least three different focal planes, for example, by comparing the images to the test pattern or a target image that corresponds to the test pattern. Then, an interpolation function is fit to the sets of calibration parameters. In particular, the argument of the interpolation function F is the difference between an arbitrary focal plane (which is sometimes referred to as an image plane) and a reference focal plane of the photo-lithographic system ($\Delta f$) normalized to a wavelength $\lambda$ (such as the characteristic wavelength used in the photo-lithographic process and/or a characteristic wavelength used when capturing the images), and the output is the set of calibration parameters Y at the arbitrary focal plane. Thus, the interpolation function may be expressed as $$Y = F\left(\frac{\Delta f}{\lambda}\right).$$

Note that the set of calibration parameters Y can then be used in subsequent simulations of the photo-lithographic process, such as simulations of a wafer pattern at the arbitrary focal plane of the photo-lithographic system based on an illuminated mask pattern at an object plane of the photo-lithographic system and a model of the optical path in the photo-lithographic system.

A wide variety of fitting techniques may be used when determining the interpolation functions, for example, least-squares fitting or non-linear fitting techniques (such as a Levenberg-Marquardt least-squares minimization technique). Moreover, many different interpolation functions may be used, such as cubic splines, polynomials, ortho-normal functions, etc. In an exemplary embodiment, the interpolation function is a quadratic function, i.e., $$Y = A_0 + A_1\left(\frac{\Delta f}{\lambda}\right) + A_2\left(\frac{\Delta f}{\lambda}\right)^2,$$

where $A_0$ is a constant term which corresponds to an average of at least the three sets of calibration parameters, $A_1$ is the coefficient of the linear term and $A_2$ is the coefficient of the quadratic term. This quadratic interpolation function is illustrated in FIG. 1, which presents a drawing illustrating an interpolation function 110 (with is associated with a test pattern 112) in a multi-dimensional calibration-parameter space for use in a model of the photo-lithographic process. In particular, interpolation function 110 fits sets of calibration parameters 114 (which are associated with different images of test pattern 112) as a function of focal plane 116 to provide estimated calibration parameters 118.

In some embodiments, sets of calibration parameters 114 include at least: the exposure dose of the scanner in the photo-lithographic system, the nominal best focus position in photo-lithographic system, the photo-resist diffusion length or acid diffusion length (which is a function of the illumination intensity), the photo-mask bias, photo-mask rounding, and/or the illumination source apodization (i.e., how sharp is the cutoff at the edge of the source pattern). These calibration parameters may, at least in part, specify the coefficients and the modulation transfer function in a set of transmission cross coefficients (and, in particular, a constant term, a linear term and a quadratic term) during the simulations (which corresponds to the optical path in the photo-lithographic system). For example, using estimated calibration parameters 118 which are inferred from interpolation function 110 at the arbitrary focal plane, the coefficients of kernels in a set of transmission cross coefficients during the simulations can be expressed in terms of a sub-set of Bessel functions that are ortho-complete over the simulation domain. Furthermore, the calibration technique may allow non-Kirchhoff three-dimensional photo-mask effects to be included in the simulations. This approach to determining the interpolation function may balance the fitting errors and the edge-placement errors in the analysis. Note that the set of transmission cross coefficients may be expressed as a large, sparse matrix that may be decomposed and truncated to extract eigenvalues, as is known to one of skill in the art.

In an exemplary embodiment, the test pattern for a photo-lithographic process that produces a 32-nm-node memory device contact layer includes an array of rectangles, such as a 300×130 nm$^2$ rectangle that is repeated on a 400×250 nm$^2$ grid within a 6000×6000 nm$^2$ expanse. Moreover, there may be multiple arrays that collectively occupy a large portion of a photo-mask, e.g., 10×10 mm$^2$. In other embodiments, the test pattern includes rectangles, squares and/or hammerhead/dog-bone shapes.

When measuring the images of the test pattern, the scanner wavelength was 193 nm. Furthermore, images were measured at 0 and ±30 nm defocus (in other embodiments, ±50 nm defocus is used). The resulting quadratic interpolation function had $A_0$ equal to 0.028258, $A_1$ equal to 0.025525, and $A_2$ equal to −0.170686. This interpolation function was determined using a Levenberg-Marquardt least-squares minimization technique that minimized the root-mean-square error between a multiple kernel model of the transmission cross coefficients and wafer critical-dimension measurements for the test pattern as a function of defocus.

In some embodiments, Levenberg-Marquardt least-squares minimization technique is implemented using a parallel process. During this process, a Jacobian matrix with partial derivatives of simulations of the multiple kernel model of the transmission cross coefficients with respect to parameters in the multiple kernel model of the transmission cross coefficients is computed.

Note that the images may be a bitmap or grayscale files that include sets of values corresponding to pixels in the images. In some embodiments, the images include real and imaginary components (or equivalently, magnitude and phase information). For example, images that include magnitude and relative phase information may be measured by generating an interference pattern using measurement and reference beams derived from a common light source or that are spatially and temporally coherent. Alternatively, phase contrast optics may be utilized.

Figure 2:
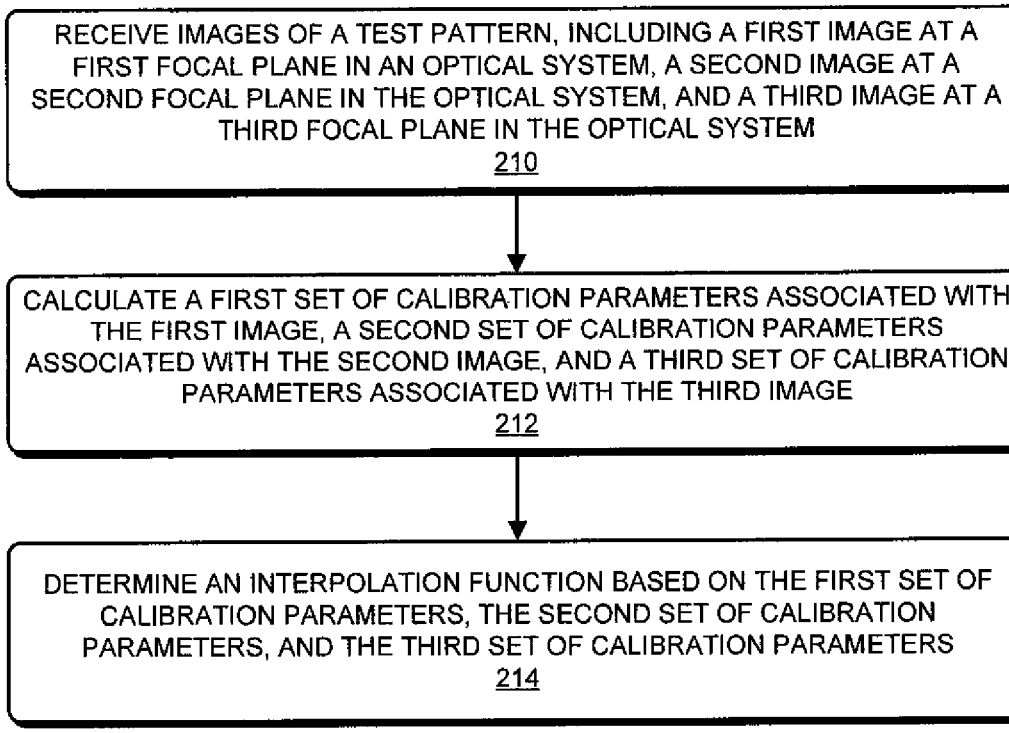
FIG. 2 is a flow chart illustrating a process for determining a set of calibration parameters for use in the model of the photo-lithographic process in accordance with an embodiment of the present disclosure.
Figure 5:
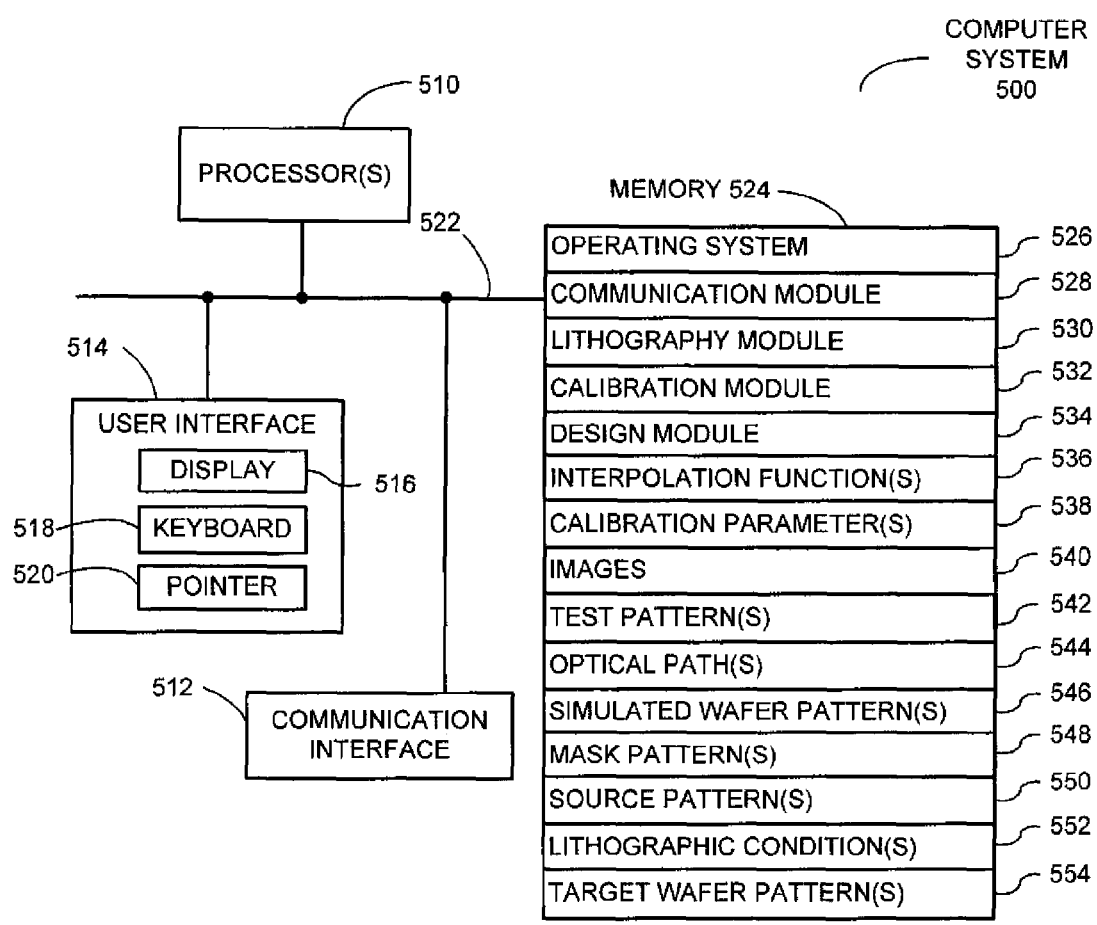
FIG. 5 is a block diagram illustrating a computer system that performs the process of FIG. 2 in accordance with an embodiment of the present disclosure.

FIG. 2 presents a flow chart illustrating a process 200 for determining a set of calibration parameters for use in the model of the photo-lithographic process, which may be performed by a computer system (such as computer system 500 in FIG. 5). During operation, the computer system receives images of a test pattern (operation 210). This test pattern was produced using the photo-lithographic process. Furthermore, the images include a first image at a first focal plane in an optical system, a second image at a second focal plane in the optical system, and a third image at a third focal plane in the optical system, where the first focal plane, the second focal plane and the third focal plane are different. Then, the computer system calculates a first set of calibration parameters associated with the first image, a second set of calibration parameters associated with the second image, and a third set of calibration parameters associated with the third image (operation 212). Next, the computer system determines an interpolation function based on the first set of calibration parameters, the second set of calibration parameters, and the third set of calibration parameters (operation 214), where the interpolation function provides the set of calibration parameters corresponding to an arbitrary focal plane in a photo-lithographic system (such as an exposure tool) that implements the photo-lithographic process, and where the set of calibration parameters are used in a set of transmission cross coefficients in the model of the photo-lithographic process.

In some embodiments, one of the first focal plane, the second focal plane and the third focal plane is a focal plane of the photo-lithographic system. Moreover, calculating a given set of calibration parameters (which can be the first set of calibration parameters, the second set of calibration parameters or the third set of calibration parameters) associated with a given focal plane (which can be the first focal plane, the second focal plane or the third focal plane) may involve comparing a given image (which can be the first image, the second image or the third image) with the target pattern or a target image corresponding to the test pattern.

In some embodiments, the computer system determines a mask pattern at an object plane in the photo-lithographic system using an inverse optical calculation based on one or more target wafer patterns at one or more focal planes in the photo-lithographic system and the model of a photo-lithographic process. This calculation may use one or more sets of calibration parameters determined using the interpolation function.

Note that in some embodiments of process 200 there are additional or fewer operations, the order of the operations may be changed, and two or more operations may be combined into a single operation. For example, more than three images and/or more than three sets of calibration parameters may be used to determine the interpolation function. In some embodiments, the interpolation function is a closed-form expression. However, in other embodiments the interpolation function is implemented as a look-up table, and values of the calibration parameters for the arbitrary focal plane may be obtained by interpolating between adjacent values in the look-up table or by extrapolating one or more values proximate to an end of the look-up table.

As noted previously, the manufacturing performance of a particular photo-lithographic process (including the depth of focus or DOF at a given exposure latitude or EL, the Mask Error Enhancement Factor or MEEF, etc.) may be evaluated in simulations of the photo-lithographic process. Furthermore, mask patterns (corresponding to photo-masks) and/or source patterns may be determined in additional calculations. These simulations and calculations may involve a forward optical calculation and/or an inverse optical calculation.

Figure 3A:
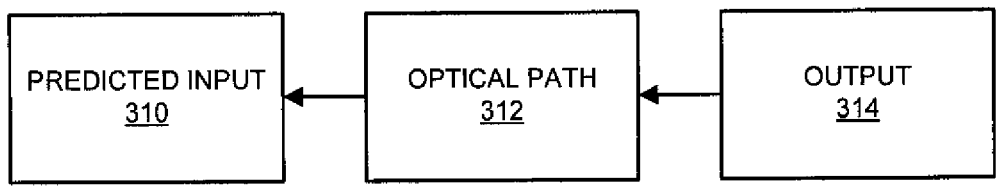
FIG. 3A is a block diagram illustrating an inverse optical calculation in accordance with an embodiment of the present disclosure.

FIG. 3A presents a block diagram illustrating an inverse optical calculation 300. In the inverse optical calculation 300, a suitably illuminated predicted input 310 (such as a mask pattern) is determined using an optical path 312 of the photo-lithographic system having an output 314 (such as a desired target wafer pattern, for example a layer in a circuit design, which may be represented using a vector-based format such as Graphic Design System II and/or OASIS format) in one of its image planes (which, as noted previously, are also sometimes referred to as focal planes). In particular, $$M = I^{-1} W,$$

where I is a forward optical path operator (described in FIG. 3B below), $I^{-1}$ is an inverse optical path operator, W is the target wafer pattern (for example, the layer in the circuit design), and M is the mask pattern. Note that optical path 312 may include illumination and/or optical effects.

It will be recognized by one of ordinary skill in the art that inverse optical calculation 300 described in FIG. 3A is ill defined. In particular, numerous possible estimated mask patterns may result in the same desired target wafer pattern. Therefore, the estimated mask pattern may be selected such that it is 'most likely' to represent the target wafer pattern. A variety of constraints and additional criteria may be imposed when determining the solution(s) to this problem in order to find a unique answer(s). For example, estimated mask patterns that, when projected through the optical path of the photo-lithographic system, correspond to the target wafer pattern are more likely to represent the actual photo-mask than other mask patterns (i.e., may have the smallest value of an error function that corresponds to the difference of a simulated wafer pattern, which can be determined using a forward optical calculation such as that described below with reference to FIG. 3B, and the target wafer pattern).

The inverse optical calculation 300 may utilize more than one output. For example, one or more target wafer patterns at different focal planes, different wavelengths and/or different imaging conditions may be used in a mask-pattern simulator. These target wafer patterns may include intensity, magnitude and/or phase information. In some embodiments, the difference of target wafer patterns may be used as output 314 in inverse optical calculation 300. Furthermore, in some embodiments each of the target wafer patterns used in inverse optical calculation 300 or a term(s) including some combination of the target wafer patterns may be multiplied by a corresponding weight. In this way, the calculation (and thus, the results) may emphasize one or more of the target wafer patterns relative to other target wafer patterns.

Figure 3B:
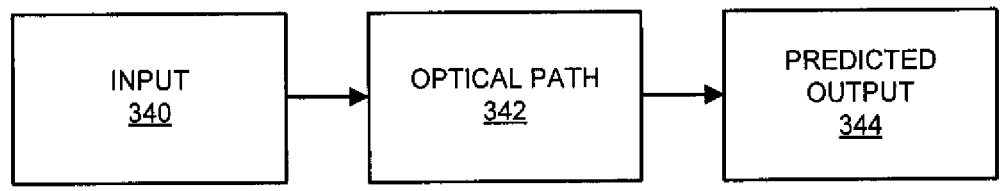
FIG. 3B is a block diagram illustrating a forward optical calculation in accordance with an embodiment of the present disclosure.

In another exemplary embodiment, one or more simulated wafer patterns are determined using a forward optical calculation. This is illustrated in FIG. 3B, which presents a block diagram illustrating a forward optical calculation 330. In forward optical calculation 330, a predicted output 344 (such as a simulated wafer pattern) is determined using an optical path 342 having a suitably illuminated input 340 (such as a mask pattern) at one of its object planes. For example, after determining the mask pattern using inverse optical calculation 300, its manufacturing performance (such as the associated process window) may be evaluated by simulating wafer patterns using forward optical calculation 330 in a lithographic simulator. In some embodiments, optical path 342 includes some or all of the aspects of the photo-lithographic process, such as: illumination settings, the electromagnetics of the photo-mask, the stepper optics, etc. In addition, the lithographic simulator may include a model of a photoresist used in the photo-lithographic process, as well as flare and/or etch effects.

Note that calculations corresponding to one or more optical paths in an inverse optical calculation and/or a forward optical calculation may be implemented using Fourier-optical techniques. Furthermore, the optical paths in an inverse optical calculation and/or a forward optical calculation may include multiple models of optical paths, such as for photo-lithographic processes that involve multiple exposure operations or exposure tools. Also note that while optical path 312 (FIG. 3A) and optical path 342 have been traversed in particular directions, each of these optical paths may be traversed in either direction.

We now further discuss exemplary embodiments of an inverse optical calculation to determine a mask pattern. The inverse optical calculation may be based on minimization of an error function (which is also sometimes referred to as a cost function, a merit function or a Hamiltonian function). During each iteration of the inverse optical calculation, the error function may be a function of the difference between a simulated wafer pattern that results when an estimated mask pattern is projected through optical path 342 (FIG. 3B) and the target wafer pattern. In some embodiments, the estimated mask pattern initially corresponds to a target mask pattern, and as the calculation progresses the estimated mask pattern is allowed to evolve while the target wafer pattern is held constant. When multiple target wafer patterns are used (such as target wafer patterns or images at different image planes), in some embodiments the error function (H) equals $$\sum_{j=1}^{N} w_j |I_j - I_{oj}|^n,$$

where $I_j$ is the simulated wafer pattern associated with the forward projection of the jth estimated mask pattern (out of N estimated mask patterns in this example) through optical path 342 (FIG. 3B), $w_j$ is a corresponding weight, $I_{oj}$ is the jth target wafer pattern, and n is a power. Note that the error function (H) approaches zero as $I_j$ approaches $I_{oj}$.

In an exemplary embodiment, N is 3 and n is 2. The 3 target wafer patterns may be determined at 3 different focal planes (or focus settings) in the photo-lithographic system. For example, with a wavelength of 260 nm, the focal planes may be at −600 nm (relative to nominal focus), at 0 nm (i.e., at nominal focus), and 600 nm (relative to nominal focus). Alternatively or in addition, the 3 target wafer patterns may be determined at three different wavelengths or imaging conditions. Furthermore, a corresponding set of weights {$w_j$} may be 1, 0.1, and 1.

In other embodiments, the weights are varied as the inverse optical calculation progresses and/or different weights are used for specific parts (or even pixels) of a target wafer pattern (such as different topological environments associated with features in the target wafer pattern). For example, the weights may be determined based on the difference between $I_j$ and $I_{oj}$ at a given point in the calculation. This approach may exaggerate the features in the circuit design, especially when the calculation is close to a local or global minimum and the error function (H) corresponds to small differences. Thus, in general the error function (H) may be expressed as a double integral over the wafer-pattern area and there may be separate time-dependent weights for $I_j$ and $I_{oj}$. Furthermore, in some embodiments the error function (H) is expressed as a relative difference between $I_j$ and $I_{oj}$ for at least a portion of the calculation as it progresses.

We now describe an exemplary embodiment of the forward optical calculation used when determining a simulated wafer pattern. For simplicity, coherent illumination of the mask pattern is utilized. Furthermore, the electric field falling upon the mask pattern is approximately constant. Thus, the clear regions of the mask pattern pass the light, while the opaque regions block the light. It follows that a scalar electric field E, just behind the mask pattern, may be expressed as $$E(\vec{r}) = \begin{cases} 0 & \text{chrome} \\ 1 & \text{glass} \end{cases},$$

where $\vec{r} = (x, y)$ is a point on the (x,y) plane. This representation of the mask pattern may be re-expressed using a function φ (referred to as a level-set function) having positive regions that indicate glass and negative regions that indicate chrome. Furthermore, the level-set function may equal zero at the boundaries or contours of the mask pattern. Therefore, the electric field E associated with the mask pattern may be re-expressed as a function of this level-set function, i.e., $$E(\vec{r}) = \hat{h}(\varphi(x,y)),$$

where ĥ is the Heaviside function $$\hat{h}(x) = \begin{cases} 1 & x \geq 0 \\ 0 & x < 0 \end{cases}.$$

Because an ideal diffraction limited lens acts as a low-pass filter, this may be used as an approximation to the actual (almost but not quite perfect) lens in the optical path of the exposure tool. Mathematically, the action of the lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and Ĉ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{cases} 0 & k_x^2 + k_y^2 \geq k_{max}^2 \\ 1 & k_x^2 + k_y^2 < k_{max}^2 \end{cases},$$

wherein $k_x$, $k_y$, and $k_{max}$ represent frequency coordinates in Fourier space. Therefore, the aerial image at the wafer is simply the square of the electric field $$I(\vec{r}) = |A(\vec{r})|^2.$$

Combining these two equations, we find $$F(\varphi(x,y)) = (|f^{-1}(\hat{C}(f(\hat{h}(\varphi(x,y)))))|^2).$$

This is a self-contained formula for the image seen by the wafer. In some embodiments, the simulated wafer pattern is expressed as a level-set function during the forward optical calculation. Then, when the calculation is finished, the simulated wafer pattern may be determined by evaluating this level-set function in a plane of the wafer (e.g., the simulated wafer pattern may correspond to values where the level-set function equals zero).

Note that this is just one embodiment of the forward projector that can be used within the scope of this disclosure, chosen by way of example due to its relative simplicity. More sophisticated forward optical calculations also fall within the scope of the present disclosure. Such models may take into account, by way of example but not limitation, various illumination conditions (e.g., off-axis, incoherent), the actual electromagnetics of the light field interacting with the photo-mask, various types of photo-masks other than chrome on glass (e.g., attenuated phase shifting, strong phase shifting, other materials, etc.), the polarization of the light field, the actual properties of the lens (such as aberrations), and/or the vector nature of the electromagnetic field as it propagates through optical path 342 (FIG. 3B).

Figure 4:
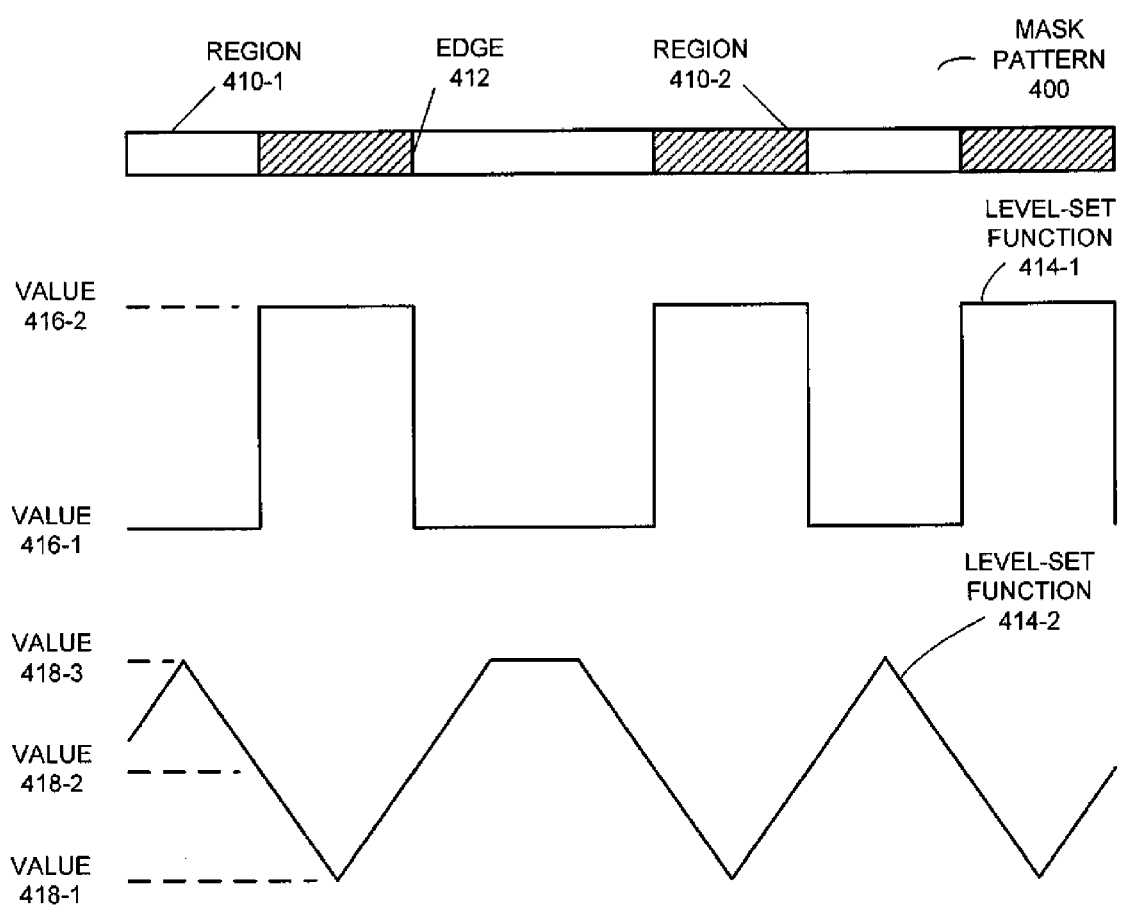
FIG. 4 is a diagram illustrating a mask pattern and corresponding level-set functions in accordance with an embodiment of the present disclosure.

We now describe the level-set functions in more detail. In the forward optical calculation, the mask pattern(s) and/or the simulated wafer pattern(s) may be represented using one or more functions having a set of values or a range that is larger than the actual mask pattern(s) and/or the simulated wafer pattern(s). As discussed previously, in one embodiment the one or more functions include one or more level-set functions. This is illustrated in FIG. 4, which presents a mask pattern 400 and corresponding level-set functions 414. Pattern 400 includes alternating regions 410, such as glass and chromium (for a mask pattern) or features and spaces (for a simulated wafer pattern). Transitions from one region to another are characterized by a contour or an edge, such as edge 412. When viewed from a direction perpendicular to a plane of FIG. 4, edges (such as edge 412) define pattern 400.

Level-set function 414-1 has two values 416. Edge 412 may correspond to a mid-point between these two values 416. In contrast, level-set function 414-2 has three values 418, and edge 412 may correspond to value 418-2. While not illustrated in FIG. 4, level-set functions 414 extend into the plane of FIG. 4 (i.e., they are 3-dimension functions). As is known to one of skill in the art, there are many alternate level-set functions and/or configurations that may be used. For example, in some embodiments one or more separate level-set functions and/or separate images may be used for the one or more simulated wafer patterns.

As illustrated by level-set function 414-2, in some embodiments the level-set function may be expressed as a signed distance function relative to the contour or edge 412 (i.e., the value of the level-set function in at least a region is a function of the distance from edge 412). This formulation may allow effects that occur nearer to edge 412 to be highlighted. However, because features in mask patterns and patterned wafers may occur at random locations (including those far removed from edge 412), level-set function 414-1 may be useful in that it provides an equal weighting with respect to edge 412.

In some embodiments, during each iteration of the inverse optical calculation the level-set function corresponding to one of the estimated mask patterns being modified is updated according to $$\varphi_{i+1} = \varphi_i + \Delta t \cdot \nabla(H),$$

where $\varphi_{i+1}$ is an updated version of the level-set function, $\varphi_i$ is the current version of the level-set function, Δt is a step size in the calculation and ∇(H) is a gradient or a derivative of the error function. In an exemplary embodiment, ∇(H) is $$\left. \frac{\delta H}{\delta \varphi} \right|_{\varphi_i},$$

i.e., it is the Frechet derivative of the error function H. Furthermore, in some embodiments ∇(H) is the direction of steepest descent for minimizing or optimizing H by changing φ. Furthermore, in some embodiments a $1^{st}$ order and/or a $3^{rd}$ order Runge-Kutta method is used when updating $\varphi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of the inverse optical calculation. In particular, the error function H may be allowed to increase during some steps as the calculation evolves. In this way, the global minimum in the multi-dimensional space may be determined. Note that the size of this multi-dimensional space corresponds to a number of quantization levels to the power of the number of pixels in the estimated mask pattern. In an exemplary embodiment, these images have at least 1 million pixels (for example, 1024×1024).

In one embodiment, in any iteration of the calculation changes in ϕ that decrease or increase the error function up to 0.5% are performed. If a larger change will result (i.e., ΔH>0.5%), the step size Δt is decreased by a factor that is at least greater than 1 and the change in ϕ is implemented (or not) based on a probability and a value P given by $$e^{\frac{-kH_{i+1}}{H_i}},$$

where $H_{i+1}$ is the error function in the $i+1^{th}$ iteration (if the change in ϕ is implemented) and $H_i$ is the error function in $i^{th}$ iteration (note that the ratio of $H_{i+1}/H_i$ equals 1+ΔH). In some embodiments k is 0.155. For example, if the value P is 0.3 and a random number between 0 and 1 is less than P, the error function is increased before proceeding. In this way, the inverse optical calculation initially takes large steps and thereby explores the solution space.

Furthermore, in some embodiments, the inverse optical calculation is divided into a series of overlapping sub-problems (also referred to as work units) at least some of which are processed independently and/or concurrently. These work units may be based on elements or structures (for example, repetitive structures) in the target mask pattern(s), the target wafer pattern(s), and/or in the simulated wafer pattern(s). Furthermore, in some embodiments the work units may partially overlap neighboring work units. For example, the work units may be between 10,000 $nm^2$ and 100 $\mu m^2$ in size.

In some embodiments, the inverse optical calculation is run for 100, 1000 or 10,000 iterations at which point the optimal solution has been determined. In other embodiments, the calculation is stopped based on convergence criteria, such as: oscillatory behavior, a relative and/or absolute difference between the simulated wafer pattern associated with the estimated mask pattern and the target wafer pattern, the latest change to the error function H, and/or the history of changes to the error function H. For example, the relative difference may be less than 1% and/or the absolute difference may be 10 nm for a CD of 100 nm. Note that in some embodiments, the level-set function is re-distanced (i.e., restored to one having the distance function property relative to edge 412) at intermediate iterations during the calculation. In an exemplary embodiment, such re-distancing occurs at least every 20 iterations (for example, every 14 iterations).

We now discuss computer systems for implementing the calibration technique. FIG. 5 presents a block diagram illustrating a computer system 500 that performs process 200 (FIG. 2). This computer system includes one or more processors 510, a communication interface 512, a user interface 514, and one or more signal lines 522 coupling these components together. Note that the one or more processors 510 may support parallel processing and/or multi-threaded operation, the communication interface 512 may have a persistent communication connection, and the one or more signal lines 522 may constitute a communication bus. Moreover, the user interface 514 may include a display 516, a keyboard 518, and/or a pointer 520, such as a mouse.

Memory 524 in the computer system 500 may include volatile memory and/or non-volatile memory. More specifically, memory 524 may include ROM, RAM, EPROM, EEPROM, FLASH, one or more smart cards, one or more magnetic disc storage devices, and/or one or more optical storage devices. Memory 524 may store an operating system 526 that includes procedures (or a set of instructions) for handling various basic system services for performing hardware dependent tasks. The memory 524 may also store procedures (or a set of instructions) in a communication module 528. The communication procedures may be used for communicating with one or more computers and/or servers, including computers and/or servers that are remotely located with respect to the computer system 500.

Memory 524 may also include multiple program modules (or sets of instructions), including: lithography module 530 (or a set of instructions), calibration module 532 (or a set of instructions), and design module 534 (or a set of instructions). Note that one or more of these program modules (or sets of instructions) may constitute a computer-program mechanism.

Calibration module 532 may determine one or more interpolation functions 536 based on sets of calibration parameters 538 associated with images 540 of one or more test patterns 542. These interpolation functions may allow calibration parameters to be determined at an arbitrary focal plane associated with one or more models of optical paths 544 in a photo-lithographic system, such as an exposure tool. For example, lithography module 530 may use one of interpolation functions 536 to determine estimated calibration parameters at the arbitrary focal plane when simulating wafer patterns 546 based on one or more mask patterns 548, one or more source patterns 550 and/or lithographic conditions 552. Note that wafer patterns 546 may be aerial images, or may include developed wafer patterns (such as when lithography module 530 includes a photoresist model). In some embodiments, lithography module 530 performs multiple simulations to determine a process window associated with the photo-lithographic process. This process window may be based on/include: a range of exposure times, a depth of focus, a range of exposure intensities, and/or a normalized image log slope.

Similarly, design module 534 may use one of interpolation functions 536 to determine estimated calibration parameters at the arbitrary focal plane when designing one or more mask patterns 548 and/or one or more source patterns 550 based on one or more target wafer patterns 554.

Instructions in the various modules in the memory 524 may be implemented in a high-level procedural language, an object-oriented programming language, and/or in an assembly or machine language. The programming language may be compiled or interpreted, i.e., configurable or configured to be executed by the one or more processors 510.

Although the computer system 500 is illustrated as having a number of discrete items, FIG. 5 is intended to be a functional description of the various features that may be present in the computer system 500 rather than as a structural schematic of the embodiments described herein. In practice, and as recognized by those of ordinary skill in the art, the functions of the computer system 500 may be distributed over a large number of servers or computers, with various groups of the servers or computers performing particular subsets of the functions. In some embodiments, some or all of the functionality of the computer system 500 may be implemented in one or more ASICs, one or more field programmable gate arrays (FPGAs), and/or one or more digital signal processors (DSPs).

In some embodiments, the calibration technique may be implemented as a stand-alone software application, or as a program module or subroutine in another application, such as photo-lithographic design software. Furthermore, the software may be configured to execute on a client or local computer, such as: a personal computer, a laptop computer, or other device capable of manipulating computer readable data, or between two or more computing systems over a network (such as the Internet, World Wide Web or WWW, Intranet, LAN, WAN, MAN, or combination of networks, or other technology enabling communication between computing systems). Therefore, information used when determining the interpolation function(s) may be stored locally (for example, on the local computer) and/or remotely (for example, on a computer or server that is accessed via a network).

Computer system 500 may include fewer components or additional components, two or more components may be combined into a single component, and/or a position of one or more components may be changed. In some embodiments the functionality of the computer system 500 may be implemented more in hardware and less in software, or less in hardware and more in software, as is known in the art.

Note that the preceding embodiments may be used for mask patterns corresponding to: chromium-on-glass photo-masks, alternating phase-shifting photo-masks, attenuating phase-shifting photo-masks, and/or multiple-exposure photo-masks (i.e., where patterns printed using two or more photo-masks are combined to produce a desired pattern).

We now discuss data structures that may be used in the computer system 500 (FIG. 5). FIG. 6 presents a block diagram illustrating a data structure 600. This data structure may include information corresponding to one or more images 610 of a test pattern. For a given image, such as image 610-1, data structure 600 may include: focal plane 612-1, locations 614-1, pixel values 616-1 associated with locations 614-1, and optional phases associated with locations 614-1.

FIG. 7 presents a block diagram illustrating a data structure 700. This data structure may include information corresponding to one or more interpolation functions 710. For a given interpolation function, such as interpolation function 710-1, data structure 700 may include: coefficients 712-1, and exponents 714-1 associated with coefficients 712-1.

Note that in some embodiments of data structures 600 and/or 700 there may be fewer or additional components, two or more components may be combined into a single component, and/or a position of one or more components is changed. For example, data structure 600 may include information about the lithographic conditions, such as the type of illumination (such as disk, point, annulus, sigmas, etc.) and/or the details of the optics (such as one or more wavelengths used or the numerical aperture).

While the preceding discussion has focused on a calibration technique for determining an interpolation function for calibration parameters associated with a photo-lithographic process, in other embodiments these techniques may also be applied to determine an interpolation function for the calibration parameters associated with a direct write beam in optical or electron-beam direct-write lithography.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a set of calibration parameters for use in a model of a photo-lithographic process, comprising:

receiving images of a test pattern, wherein the test pattern was produced using the photo-lithographic process, wherein the images include a first image at a first focal plane in an optical system, a second image at a second focal plane in the optical system, and a third image at a third focal plane in the optical system, and wherein the first focal plane, the second focal plane and the third focal plane are different;

calculating, by a computer, a first set of calibration parameters associated with the first image, a second set of calibration parameters associated with the second image, and a third set of calibration parameters associated with the third image; and determining an interpolation function based on the first set of calibration parameters, the second set of calibration parameters, and the third set of calibration parameters, wherein the interpolation function provides the set of calibration parameters corresponding to an arbitrary focal plane in a photo-lithographic system that implements the photo-lithographic process; and wherein the set of calibration parameters are used in a set of transmission cross coefficients in the model of the photo-lithographic process.

2. The method of claim 1, wherein the interpolation function includes a quadratic function of a difference between the arbitrary focus plane and a reference focal plane of the photo-lithographic system.

3. The method of claim 2, wherein the difference is normalized by a characteristic wavelength used in the photo-lithographic process.

4. The method of claim 2, wherein the difference is normalized by a characteristic wavelength used when capturing the images.

5. The method of claim 2, wherein the quadratic function includes a constant term which corresponds to an average of the first set of calibration parameters, the second set of calibration parameters, and the third set of calibration parameters.

6. The method of claim 2, wherein the quadratic function includes a linear dependence on the difference.

7. The method of claim 1, wherein one of the first focal plane, the second focal plane and the third focal plane is a focal plane of the photo-lithographic system.

8. The method of claim 1, wherein calculating a given set of calibration parameters, which can be the first set of calibration parameters, the second set of calibration parameters or the third set of calibration parameters, associated with a given focal plane, which can be the first focal plane, the second focal plane or the third focal plane, involves comparing a given image, which can be the first image, the second image or the third image, with a target image corresponding to the test pattern.

9. The method of claim 1, further comprising determining a mask pattern at an object plane in the photo-lithographic system using an inverse optical calculation based on one or more target wafer patterns at one or more focal planes in the photo-lithographic system and the model of a photo-lithographic process, wherein the determining may involve one or more sets of calibration parameters determined using the interpolation function.

10. The method of claim 1, wherein the images include critical-dimension scanning-electron-microscope images of the test pattern.

11. A computer-program product for use in conjunction with a computer system, the computer-program product comprising a non-transitory computer-readable storage medium and a computer-program mechanism embedded therein for determining a set of calibration parameters for use in a model of a photo-lithographic process, the computer-program mechanism including:
    instructions for receiving images of a test pattern, wherein the test pattern was produced using the photo-lithographic process, wherein the images include a first image at a first focal plane in an optical system, a second image at a second focal plane in the optical system, and a third image at a third focal plane in the optical system, and wherein the first focal plane, the second focal plane and the third focal plane are different;
    instructions for calculating a first set of calibration parameters associated with the first image, a second set of calibration parameters associated with the second image, and a third set of calibration parameters associated with the third image; and
    instructions for determining an interpolation function based on the first set of calibration parameters, the second set of calibration parameters, and the third set of calibration parameters, wherein the interpolation function provides the set of calibration parameters corresponding to an arbitrary focal plane in a photo-lithographic system that implements the photo-lithographic process; and
    wherein the set of calibration parameters are used in a set of transmission cross coefficients in the model of the photo-lithographic process.

12. The computer-program product of claim 11, wherein the interpolation function includes a quadratic function of a difference between the arbitrary focus plane and a reference focal plane of the photo-lithographic system.

13. The computer-program product of claim 12, wherein the difference is normalized by a characteristic wavelength used in the photo-lithographic process.

14. The computer-program product of claim 12, wherein the quadratic function includes a constant term which corresponds to an average of the first set of calibration parameters, the second set of calibration parameters, and the third set of calibration parameters.

15. The computer-program product of claim 12, wherein the quadratic function includes a linear dependence on the difference.

16. The computer-program product of claim 11, wherein one of the first focal plane, the second focal plane and the third focal plane is a focal plane of the photo-lithographic system.

17. The computer-program product of claim 11, wherein calculating a given set of calibration parameters, which can be the first set of calibration parameters, the second set of calibration parameters or the third set of calibration parameters, associated with a given focal plane, which can be the first focal plane, the second focal plane or the third focal plane, involves comparing a given image, which can be the first image, the second image or the third image, with a target image corresponding to the test pattern.

18. The computer-program product of claim 11, wherein the computer-program mechanism further includes instructions for determining a mask pattern at an object plane in the photo-lithographic system using an inverse optical calculation based on one or more target wafer patterns at one or more focal planes in the photo-lithographic system and the model of a photo-lithographic process, wherein the determining may involve one or more sets of calibration parameters determined using the interpolation function.

19. The computer-program product of claim 11, wherein the images include critical-dimension scanning-electron-microscope images of the test pattern.

20. A computer system, comprising:
    a processor;
    a memory; and
    a program module for determining a source pattern to illuminate a photo-mask during a photo-lithographic process, the program module stored in the memory and configured to be executed by the processor to determine a set of calibration parameters for use in a model of a photo-lithographic process, the program module including:
        instructions for receiving images of a test pattern, wherein the test pattern was produced using the photo-lithographic process, wherein the images include a first image at a first focal plane in an optical system, a second image at a second focal plane in the optical system, and a third image at a third focal plane in the optical system, and wherein the first focal plane, the second focal plane and the third focal plane are different;
        instructions for calculating a first set of calibration parameters associated with the first image, a second set of calibration parameters associated with the second image, and a third set of calibration parameters associated with the third image; and
        instructions for determining an interpolation function based on the first set of calibration parameters, the second set of calibration parameters, and the third set of calibration parameters, wherein the interpolation function provides the set of calibration parameters corresponding to an arbitrary focal plane in a photo-lithographic system that implements the photo-lithographic process; and
        wherein the set of calibration parameters are used in a set of transmission cross coefficients in the model of the photo-lithographic process.

* * * * *